(12) United States Patent
Cha et al.

(10) Patent No.: US 8,717,087 B2
(45) Date of Patent: May 6, 2014

(54) ANTI-FUSE CIRCUIT

(75) Inventors: Jin Youp Cha, Icheon-si (KR); Jae Il Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/589,205

(22) Filed: Aug. 20, 2012

(65) Prior Publication Data

US 2013/0314149 A1 Nov. 28, 2013

(30) Foreign Application Priority Data

May 25, 2012 (KR) .................. 10-2012-0056121

(51) Int. Cl.
*H01H 37/76* (2006.01)

(52) U.S. Cl.
USPC .......................................... 327/525

(58) Field of Classification Search
USPC ................................. 327/524, 525
See application file for complete search history.

(56) References Cited

U.S. PATENT DOCUMENTS 6,741,117 B2 * 5/2004 Lee .............................. 327/525
7,271,989 B2 * 9/2007 Huang et al. ................. 361/91.1
7,446,593 B2 * 11/2008 Kilian et al. ................. 327/525

FOREIGN PATENT DOCUMENTS

KR 1020000003881 A 1/2000
KR 1020030091274 A 12/2003

* cited by examiner

*Primary Examiner* — Jeffrey Zweizig
(74) *Attorney, Agent, or Firm* — William Park & Associates Patent Ltd.

(57) ABSTRACT

An anti-fuse circuit includes: a rupture unit including an anti-fuse programmed in response to an input rupture signal during a program mode, and configured to generate an output rupture signal corresponding to a state of the anti-fuse to output the generated output rupture signal to a transmission node, a voltage clamp unit configured to generate a clamp voltage proportional to an external voltage level to generate the clamp voltage having a constant voltage level when the external voltage level rises to a predetermined level or more, and a fuse signal generation unit configured to reset the transmission node to the clamp voltage at the initial stage of the program mode to generate a fuse signal in response to the voltage level of the transmission node during an output mode.

12 Claims, 4 Drawing Sheets

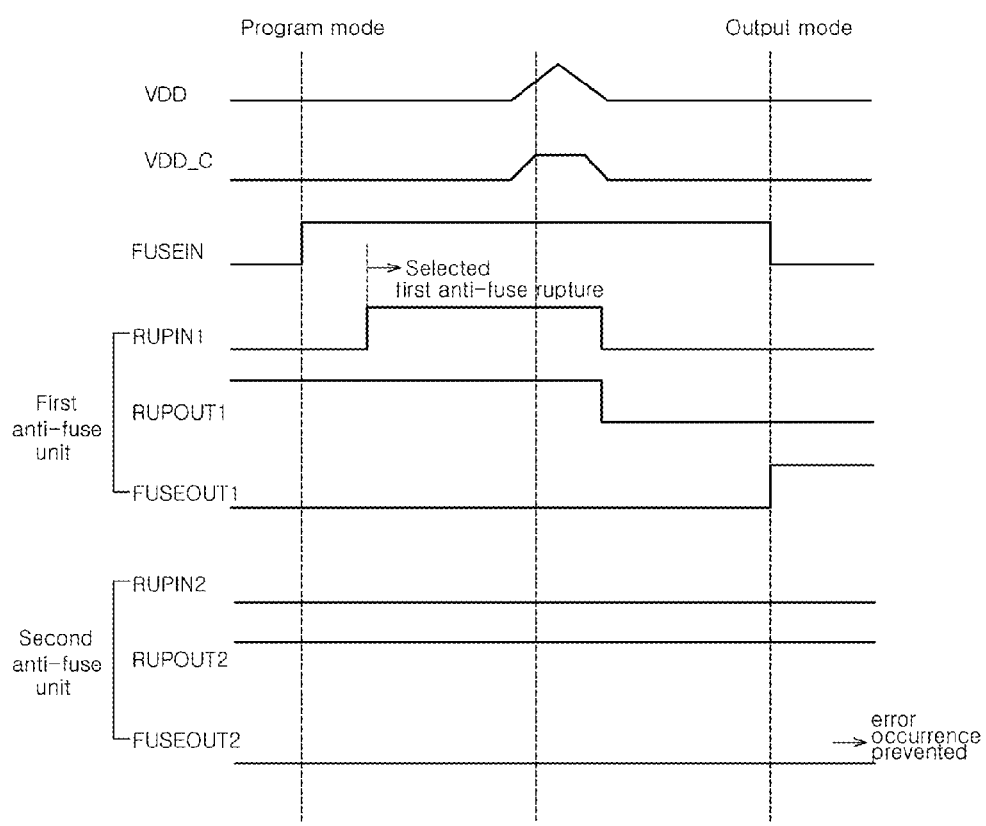

ANTI-FUSE CIRCUIT

CROSS-REFERENCES TO RELATED APPLICATION

The present application claims priority under 35 U.S.C. §119(a) to Korean application number 10-2012-0056121 filed on May 25, 2012, in the Korean Intellectual Property Office, which is incorporated by reference in its entirety.

BACKGROUND

1. Technical Field

The present invention relates generally to semiconductor design technology, and more particularly, to an anti-fuse circuit.

2. Related Art

When any one failed unit cell among numerous unit cells of a semiconductor memory apparatus is detected during a fabrication process, the semiconductor memory apparatus may not function as intended, and thus is discarded as a defective product. However, it is inefficient to discard the entire semiconductor memory apparatus as a defective product when failures occurred only in some unit cells thereof. Therefore, the semiconductor memory apparatus may be restored by replacing the failed unit cells with redundancy cells prepared therein, which makes it possible to improve the yield.

A repair operation using redundancy cells may be performed at a wafer level and a package level. At the wafer level, a fuse is used to perform the repair operation. For example, the repair operation using a fuse may include a method of cutting a fuse existing on a line connected to a row or column having a failed cell by applying an overcurrent, a method of burning a fuse using laser beams, a method of connecting junctions using laser beams, and a method of programming a fuse through EPROM.

The repair operation using a fuse may not be performed at the package level however. Therefore, an anti-fuse is used to perform a repair operation. The anti-fuse is a resistive fuse element having an electrical characteristic opposite to the fuse. In general, the anti-fuse may be formed of a thin dielectric material, such as a complex, in which a dielectric such as $SiO_2$, silicon nitride, tantalum oxide, or ONO (silicon dioxide-silicon nitride-silicon dioxide) is interposed between two conductors. The anti-fuse is electrically open in a normal state. However, when a high voltage is applied to break down the dielectric between the conductors, the anti-fuse is shorted. When a failed cell is to be replaced at the package level, a programming operation for applying a high voltage to an anti-fuse circuit is performed. After the programming operation, the anti-fuse is shorted to thereby replace the failed cell with a redundancy cell.

In addition, the anti-fuse circuit may support various test modes depending on whether or not an anti-fuse is programmed. Accordingly, the anti-fuse circuit may be used in various ways inside a semiconductor apparatus.

However, the conventional anti-fuse circuit has a problem in that the anti-fuse sensitively reacts to external environments. When an external voltage level applied to the anti-fuse circuit unexpectedly rises, the anti-fuse may break down even though a program operation was not performed. In this case, a false fuse signal is generated and causes a malfunction of the entire semiconductor apparatus.

SUMMARY

In an embodiment of the present invention, an anti-fuse circuit includes: a rupture unit including an anti-fuse programmed in response to an input rupture signal during a program mode and configured to generate an output rupture signal corresponding to a state of the anti-fuse to output the generated output rupture signal to a transmission node, a voltage clamp unit configured to generate a clamp voltage proportional to an external voltage level to generate the clamp voltage having a constant voltage level when the external voltage level rises to a predetermined level or more, and a fuse signal generation unit configured to reset the transmission node to the clamp voltage at the initial stage of the program mode to generate a fuse signal in response to the voltage level of the transmission node during an output mode.

In an embodiment of the present invention, an anti-fuse circuit includes a voltage clamp unit configured to generate a clamp voltage proportional to an external voltage level and a clamp voltage having a constant voltage level when the external voltage level rises to a predetermined level or more, and a plurality of fuse units each including an anti-fuse and configured to generate a fuse signal in response to a state of the anti-fuse, wherein the anti-fuse unit includes a rupture unit including the anti-fuse programmed in response to an input rupture signal during a program mode and configured to generate an output rupture signal corresponding to the state of the anti-fuse to output the generated output rupture signal to a transmission node, and a fuse signal generation unit configured to reset the transmission node to the clamp voltage at the initial stage of the program mode to generate a fuse signal in response to the voltage level of the transmission node during an output mode.

BRIEF DESCRIPTION OF THE DRAWINGS

Features, aspects, and embodiments are described in conjunction with the attached drawings, in which:

FIG. 4B is an operation waveform diagram of an anti-fuse circuit which includes the voltage clamp unit according to an embodiment of the present invention.

DETAILED DESCRIPTION

Hereinafter, an anti-fuse circuit according to the present invention will be described below with reference to the accompanying drawings through various embodiments.

Figure 1:
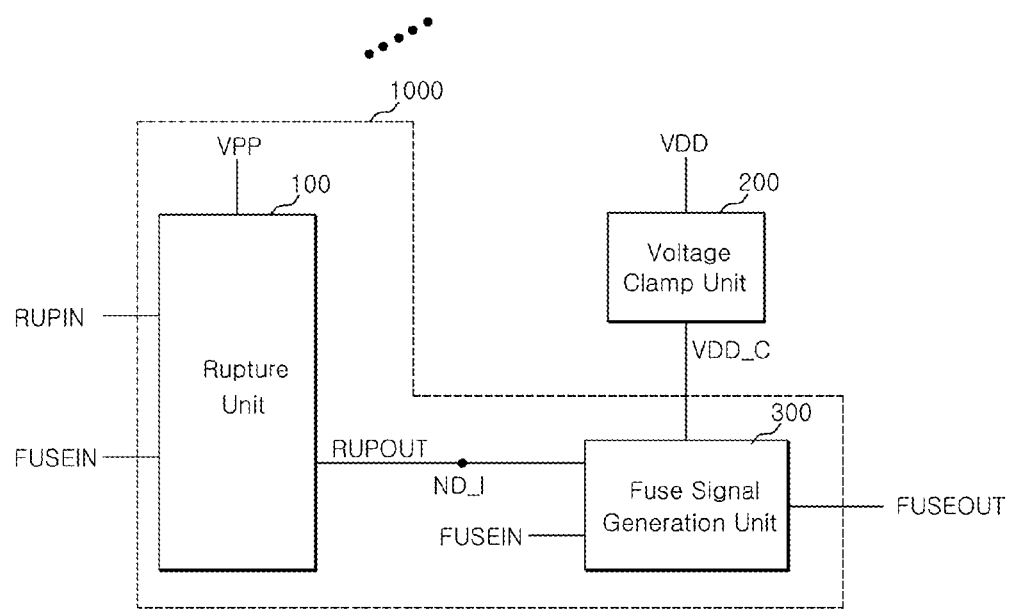
FIG. 1 is a block diagram of an anti-fuse circuit according to an embodiment of the present invention.

FIG. 1 is a block diagram of an anti-fuse circuit according to an embodiment of the present invention.

The anti-fuse circuit determines whether or not to program an anti-fuse in a program mode, and outputs a fuse signal FUSEOUT corresponding to the state of the anti-fuse in an output mode. When a program mode signal FUSEIN is activated, the anti-fuse circuit operates in the program mode, and when the program mode signal FUSEIN is deactivated, the anti-fuse circuit operates in the output mode.

The anti-fuse circuit includes a rupture unit 100, a voltage clamp unit 200, and a fuse signal generation unit 300.

The rupture unit 100 includes an anti-fuse (not illustrated) which is programmed by receiving a high voltage VPP in response to an input rupture signal RUPIN, during the program mode when the program mode signal FUSEIN is activated and inputted. The rupture unit 100 generates an output rupture signal RUPOUT corresponding to the state of the anti-fuse and outputs the generated output rupture signal RUPOUT to a transmission node ND_I.

The voltage clamp unit 200 is configured to generate a clamp voltage VDD_C proportional to an external voltage level VDD. When the external voltage level VDD rises to a predetermined level or more, the voltage clamp unit 200 generates the clamp voltage VDD_C having a constant predetermined voltage level.

The fuse signal generation unit 300 is configured to reset the transmission node ND_I to the clamp voltage VDD_C at the initial stage of the program mode, and to generate the fuse signal FUSEOUT in response to the voltage level of the transmission node ND_I at the output node when the program mode signal FUSEIN is deactivated and inputted.

Therefore, from the initial stage of the program operation, the voltage level of the transmission node ND_I may be stably maintained at the clamp voltage VDD_C. Accordingly, an external effect on an anti-fuse (not illustrated) connected to the transmission node ND_I may be minimized.

According to the embodiment of the present invention, a plurality of anti-fuse units 1000 each including the rupture unit 100 and the fuse signal generation unit 300 may be provided in response to the number of anti-fuses required by the semiconductor apparatus. The respective anti-fuse units may commonly receive the clamp voltage VDD_C generated by the voltage clamp unit 200.

Figure 2:
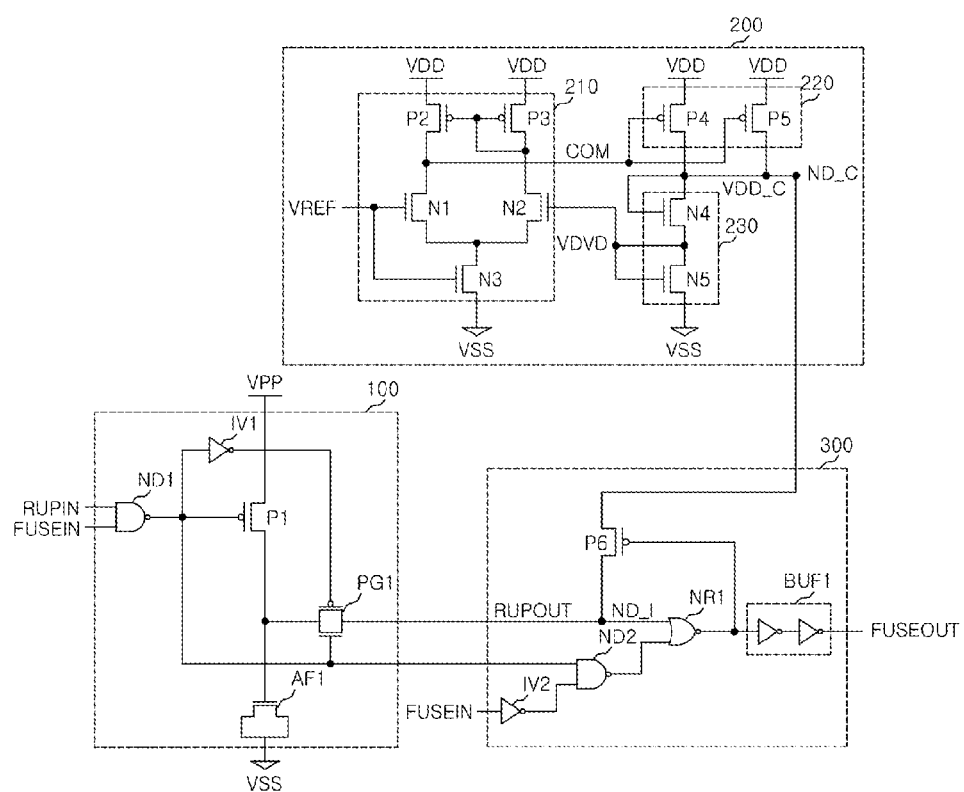
FIG. 2 is a circuit diagram of the anti-fuse circuit according to an embodiment of the present invention.

FIG. 2 is a circuit diagram of the anti-fuse circuit according to an embodiment of the present invention.

The anti-fuse circuit includes the rupture unit 100, the voltage clamp unit 200, and the fuse signal generation unit 300.

The rupture unit 100 includes an anti-fuse AF1, and is configured to receive the program mode signal FUSEIN and the input rupture signal RUPIN and to program the anti-fuse AF1 by applying a high voltage VPP. The rupture unit 100 generates the output rupture signal RUPOUT corresponding to the state of the anti-fuse, and outputs the generated signal to the transmission node ND_I. FIG. 2 illustrates a gate oxide anti-fuse which loses the property of an NMOS transistor and has the property of a conductor, when receiving a high voltage through a gate terminal thereof. However, various types of anti-fuses may be used.

Specifically, the rupture unit 100 includes a first NAND gate ND1, a first PMOS transistor P1, a first anti-fuse AF1, a first inverter IV1, and a first pass gate PG1.

The first NAND gate ND1 is configured to receive the program mode signal FUSEIN and the input rupture signal RUPIN and perform a NAND operation on the received signals.

The first PMOS transistor P1 is configured to apply the high voltage VPP to a gate terminal of the first NAND gate ND1 in response to an output signal of the first NAND gate ND1.

The first anti-fuse AF1 is electrically open in a normal state. However, when the high voltage VPP is applied to a gate terminal thereof, a dielectric of the first anti-fuse AF1 is destroyed to short the first anti-fuse AF1.

The first inverter IV1 is configured to invert the output signal of the first NAND gate ND1.

The first pass gate PG1 is configured to block the connection between the gate terminal of the first anti-fuse AF1 and the transmission node ND_I in response to the output signal of the first NAND gate ND1 and the inverted output signal.

The operation of the rupture unit 100 will be described in detail as follows.

Since the input rupture signal RUPIN is deactivated and applied at the initial stage of the program mode, the first NAND gate ND1 outputs a high-level signal. Therefore, the first PMOS transistor P1 is turned off so as not to apply the high voltage to the anti-fuse AF1, and the pass gate PG1 is turned on to connect the gate terminal of the anti-fuse AF1 to the transmission node ND_I.

When the input rupture signal RUPIN is activated, the first NAND gate ND1 transitions to a low level, and the first PMOS transistor P1 is turned on. Therefore, as the high voltage is applied to the anti-fuse AF1, the anti-fuse AF1 is shorted. Since the pass gate PG1 is turned off, the high voltage VPP does not have an effect on the transmission node ND_I.

When the anti-fuse AF1 is electrically open, or when the anti-fuse AF1 is not programmed, the rupture unit 100 generates the output rupture signal RUPOUT deactivated to a high level, and when the anti-fuse AF1 is shorted, or when the anti-fuse AF1 is programmed, the rupture unit 100 generates the output rupture signal RUPOUT activated to a low level.

The voltage clamp unit 200 generates the clamp voltage VDD_C proportional to the external voltage level VDD, and generates the clamp voltage VDD_C having a constant voltage level when the external voltage level VDD rises to a predetermined level or more. When the external voltage VDD is less than the predetermined level, the voltage clamp unit 200 outputs the external voltage level VDD as the clamp voltage VDD_C, and when the external voltage VDD is equal to or more than the predetermined level, the voltage clamp unit 200 outputs the predetermined level of voltage as the clamp voltage VDD_C.

The voltage clamp unit 200 includes a comparator 210, a driver 220, and a voltage divider 230.

The comparator 210 includes a plurality of MOS transistors P2, P3, N1, N2, and N3.

The second PMOS transistor P2 has a current path formed between the external voltage VDD and the first NMOS transistor N1, and a gate terminal thereof is connected to a drain terminal of the third PMOS transistor P3.

The third PMOS transistor P3 has a current path formed between the external voltage VDD and the second NMOS transistor N2, and drain and gate terminals thereof are connected to the gate terminal of the second PMOS transistor P2.

The first NMOS transistor N1 has a current path formed between the second PMOS transistor P2 and the third NMOS transistor N3, and a gate terminal thereof is controlled by a reference voltage VREF.

The second NMOS transistor N2 has a current path formed between the third PMOS transistor P3 and the third NMOS transistor N3, and a gate terminal thereof is controlled by a divided voltage VDVD outputted from the voltage divider 230.

The third NMOS transistor N3 has a current path formed between a ground voltage VSS and a connection point between source terminals of the first and second NMOS transistors N1 and N2, and a gate terminal thereof is controlled by the reference voltage VREF.

The driver 220 includes fourth and fifth PMOS transistor P4 and P5.

The fourth and fifth PMOS transistors P4 and P5 have a current path formed between the external voltage VDD and a clamp voltage node ND_C, and gate terminals thereof are controlled by a comparison signal COM outputted from the comparator 210.

The voltage divider 230 includes fourth and fifth NMOS transistors N4 and N5 which are serially connected in diode form between the clamp voltage node ND_C and the ground voltage VSS.

The fourth and fifth NMOS transistors N4 and N5 are configured to generate the divided voltage VDVD by dividing the clamp voltage VDD_C driven to the clamp voltage node ND_C.

The detailed operation of the voltage clamp unit 200 is performed as follows.

As the reference voltage VREF is supplied to the gate terminal of the first NMOS transistor N1 and the divided voltage VDVD outputted from the voltage divider 230 is supplied to the gate terminal of the second NMOS transistor N2, the operation is started. When the operation of the comparator 210 is started, the divided voltage VDVD has a lower voltage level than the reference voltage VREF. Therefore, the comparison signal COM is outputted at a low level. Accordingly, the fourth and fifth PMOS transistors P4 and P5 of the driver 220 supply the external voltage VDD to the clamp voltage node ND_C until the clamp voltage VDD_C approaches a predetermined level.

The voltage divider 230 divides the clamp voltage VDD_C supplied to the clamp voltage node ND_C according to the resistance ratio of the fourth and fifth NMOS transistors N4 and N5 connected in diode form. The divided voltage VDVD is supplied to the second NMOS transistor N2 of the comparator 210. When the divided voltage VDVD exceeds the reference voltage VREF, the comparator 210 supplies the high-level comparison signal COM to the fourth and fifth PMOS transistors P4 and P5, and blocks the external voltage VDD supplied to the clamp voltage node ND_C.

Figure 3:
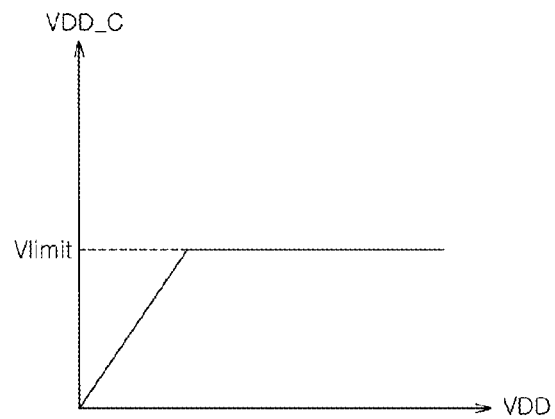
FIG. 3 is a graph showing an operation of a voltage clamp unit of FIG. 2.

The clamp voltage VDD_C supplied to the clamp voltage node ND_C rises in proportion to the external voltage VDD, as illustrated in FIG. 3. However, when the clamp voltage VDD_C supplied to the clamp voltage node ND_C approaches a predetermined voltage level, the current paths of the fourth and fifth PMOS transistors P4 and P5 are blocked. Therefore, the clamp voltage VDD_C maintains the predetermined voltage level Vlimit.

The fuse signal generation unit 300 resets the transmission node ND_I to the clamp voltage VDD_C at the initial stage of the program mode, and then generates the fuse signal FUSEOUT in response to the voltage level of the transmission node ND_I during the output mode.

The fuse signal generation unit 300 includes a second inverter IV2, a second NAND gate ND2, a sixth PMOS transistor P6, a first NOR gate NR2, and a first buffer BUF1.

The second inverter IV2 is configured to receive the program mode signal FUSEIN and invert the received program mode signal FUSEIN.

The second NAND gate ND2 is configured to receive the output signal of the first NAND gate ND1 and an output signal of the second inverter IV2 and perform a NAND operation on the received signals.

The sixth PMOS transistor P6 is configured to supply the clamp voltage VDD_C generated at the clamp voltage node ND_C to the transmission node ND_I, in response to an output signal of the first NOR gate NR1.

The first NOR gate NR1 is configured to receive the output rupture signal RUPOUT supplied to the transmission node ND_I and an output signal of the second NAND gate ND2 and perform a NOR operation on the received signals.

The first buffer BUF1 is configured to buffer an output signal of the first NOR gate NR1.

The detailed operation of the fuse signal generation unit 300 will be described as follows.

Since the activated program mode signal FUSEIN and the deactivated input rupture signal RUPIN are applied at the initial stage of the program mode, the second NAND gate ND2 generates a high-level output signal. Therefore, the first NOR gate NR1 generates a low-level output signal, and the sixth PMOS transistor P6 is turned on. Accordingly, the transmission node ND_I is reset to the clamp voltage VDD_C. Furthermore, the low-level fuse signal FUSEOUT is generated.

Although the activated input rupture signal FUSEIN is applied to program a corresponding anti-fuse, the output signal of the second NAND gate ND2 maintains a high level. Therefore, the low-level fuse signal FUSEOUT is continuously generated even during the program operation.

On the other hand, when the program mode signal FUSEIN is deactivated to switch the program mode to the output mode, the second NAND gate ND2 generates a low-level output signal. Furthermore, according to whether or not the anti-fuse AF1 is programmed, the operation result of the first NOR gate NR1 differs. When the anti-fuse AF1 is not programmed, the first NOR gate NR1 receives the high-level output rupture signal RUPOUT, and thus generates a low-level output signal. When the anti-fuse AF1 is programmed, the first NOR gate NR1 receives the low-level output rupture signal RUPOUT, and thus generates a high-level output signal. As a result, when the anti-fuse AF1 is not programmed, the low-level fuse signal FUSEOUT is generated, and when the anti-fuse AF1 is programmed, the high-level fuse signal FUSEOUT is generated.

Figure 4A:
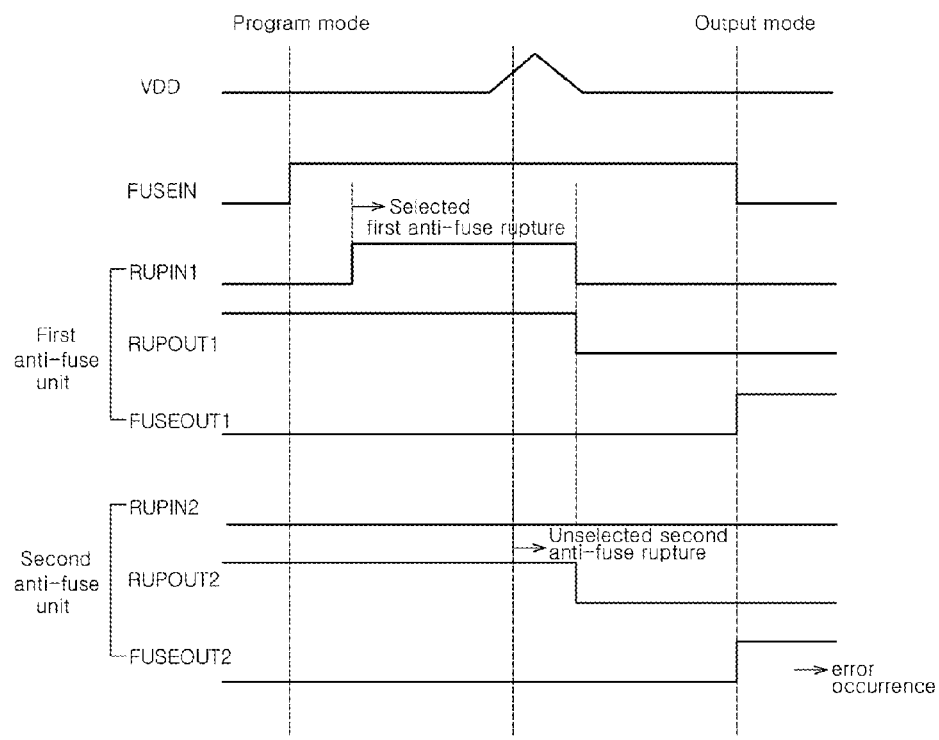
FIG. 4A is an operation waveform diagram of an anti-fuse circuit which does not include the voltage clamp unit.

FIG. 4A is an operation waveform diagram of an anti-fuse circuit which does not include the voltage clamp unit, and FIG. 4B is an operation waveform diagram of an anti-fuse circuit which includes the voltage clamp unit 200 according to an embodiment of the present invention. In FIGS. 4A and 4B, the anti-fuse circuit having two anti-fuse units (first and second anti-fuse units) is taken as an example for description.

First, the operation of the anti-fuse circuit of FIG. 4A is performed as follows.

As the program mode signal FUSEIN is activated, the anti-fuse circuit enters the program mode. Then, only a first input rupture signal RUPIN1 is activated to selectively program only an anti-fuse included in the first anti-fuse unit, and a second input rupture signal RUPIN2 is deactivated.

However, when noise (rapid rise) occurs in the external voltage VDD, the level of the rising external voltage VDD may have an effect on an anti-fuse of the unselected second anti-fuse unit. The anti-fuse of the unselected second anti-fuse unit may be abnormally broken down.

In this case, when the program mode signal FUSEIN is deactivated to switch the program mode to the output node, the selected first anti-fuse unit generates an activated first fuse signal FUSEOUT1, and the unselected second anti-fuse unit also generates an activated second fuse signal FUSEOUT2, thereby causing a malfunction of the entire semiconductor apparatus.

On the other hand, the operation of the anti-fuse circuit of FIG. 4B is performed as follows.

As the program mode signal FUSEIN is activated, the anti-fuse circuit enters the program mode. Then, only the first input rupture signal RUPIN1 is activated to selectively program only the anti-fuse included in the first anti-fuse unit, and the second input rupture signal RUPIN2 is deactivated.

According to the embodiment of the present invention, even when noise (rapid rise) occurs in the external voltage VDD, the stable clamp voltage VDD_C is supplied by the voltage clamp unit 200. Therefore, an effect on the anti-fuse by the external voltage VDD may be minimized. It is possible to prevent the anti-fuse of the unselected second anti-fuse unit from being abnormally broken down.

Therefore, when the program mode signal FUSEIN is deactivated to switch the program mode to the output mode, the selected first anti-fuse unit generates an activated first fuse signal FUSEOUT1, and the unselected second anti-fuse generates a deactivated second fuse signal FUSEOUT2. Accordingly, the entire semiconductor apparatus may continue to operate as intended.

While certain embodiments have been described above, it will be understood to those skilled in the art that the embodiments described are by way of example only. Accordingly, the anti-fuse circuit described herein should not be limited based on the described embodiments. Rather, the anti-fuse circuit described herein should only be limited in light of the claims that follow when taken in conjunction with the above description and accompanying drawings.

What is claimed is:

1. An anti-fuse circuit comprising:
   a rupture unit comprising an anti-fuse programmed in response to an input rupture signal during a program mode, and configured to generate an output rupture signal corresponding to a state of the anti-fuse to output the generated output rupture signal to a transmission node;
   a voltage clamp unit configured to generate a clamp voltage proportional to an external voltage level, and to generate the clamp voltage having a constant voltage level when the external voltage level rises to a predetermined level or more; and
   a fuse signal generation unit configured to reset the transmission node to the clamp voltage at the initial stage of the program mode, and to generate a fuse signal in response to the voltage level of the transmission node during an output mode,
   wherein the voltage clamp unit generates the clamp voltage by comparing a reference voltage with a divided voltage generated by dividing the clamp voltage.

2. The anti-fuse circuit according to claim 1, wherein the voltage clamp unit outputs the external voltage level as the clamp voltage when the external voltage is less than the predetermined level, and outputs the predetermined level of voltage as the clamp voltage when the external voltage is equal to or more than the predetermined level.

3. The anti-fuse circuit according to claim 1, wherein the voltage clamp unit comprises:
   a clamp voltage node configured to output the clamp voltage;
   a voltage divider configured to generate the divided voltage by dividing the voltage of the clamp voltage node;
   a comparator configured to compare the reference voltage to the divided voltage and output a comparison signal; and
   a driver configured to drive the clamp voltage from the external voltage, in response to the comparison signal.

4. The anti-fuse circuit according to claim 1, wherein the rupture unit comprises a pass gate configured to connect a gate terminal of the anti-fuse to the transmission node,
   wherein the pass gate is blocked while the anti-fuse is programmed by a high voltage applied in response to the activated input rupture signal, during the program mode.

5. The anti-fuse circuit according to claim 4, wherein the rupture unit generates the deactivated output rupture signal when the anti-fuse is electrically open, and generates the activated output rupture signal when the anti-fuse is shorted.

6. The anti-fuse circuit according to claim 1, wherein the fuse signal generation unit deactivates the fuse signal during the program mode, and activates the fuse signal in response to whether or not the output rupture signal is activated, during the output mode.

7. An anti-fuse circuit comprising:
   a voltage clamp unit configured to generate a clamp voltage proportional to an external voltage level, and to generate the clamp voltage having a constant voltage level when the external voltage level rises to a predetermined level or more; and
   a plurality of anti-fuse units each comprising an anti-fuse and configured to generate a fuse signal in response to a state of the anti-fuse,
   wherein each anti-fuse unit comprises:
   a rupture unit comprising the anti-fuse programmed in response to an input rupture signal during a program mode, and configured to generate an output rupture signal corresponding to the state of the anti-fuse to output the generated output rupture signal to a transmission node; and
   a fuse signal generation unit configured to reset the transmission node to the clamp voltage at the initial stage of the program mode, and to generate a fuse signal in response to the voltage level of the transmission node during an output mode.

8. The anti-fuse circuit according to claim 7, wherein the voltage clamp unit outputs the external voltage level as the clamp voltage when the external voltage is less than the predetermined level, and outputs the predetermined level of voltage as the clamp voltage when the external voltage is equal to or more than the predetermined level.

9. The anti-fuse circuit according to claim 7, wherein the voltage clamp unit comprises:
   a clamp voltage node configured to output the clamp voltage;
   a voltage divider configured to generate a divided voltage by dividing the voltage of the clamp voltage node;
   a comparator configured to compare a reference voltage to the divided voltage and output a comparison signal; and
   a driver configured to drive the clamp voltage from the external voltage, in response to the comparison signal.

10. The anti-fuse circuit according to claim 7, wherein the rupture unit comprises a pass gate configured to connect a gate terminal of the anti-fuse to the transmission node,
    wherein the pass gate is blocked while the anti-fuse is programmed by a high voltage applied in response to the activated input rupture signal, during the program mode.

11. The anti-fuse circuit according to claim 10, wherein the rupture unit generates the deactivated output rupture signal when the anti-fuse is electrically open, and generates the activated output rupture signal when the anti-fuse is shorted.

12. The anti-fuse circuit according to claim 7, wherein the fuse signal generation unit deactivates the fuse signal during the program mode, and activates the fuse signal in response to whether or not the output rupture signal is activated, during the output mode.

* * * * *